United States Patent
Lucey et al.

(10) Patent No.: US 7,310,420 B2
(45) Date of Patent: Dec. 18, 2007

(54) TELEPHONE HEADSET AMPLIFIER WITH NOISE BLANKING CAPABILITY

(75) Inventors: Robert E. Lucey, Sudbury, MA (US); Michael B. Lasky, Edina, MN (US)

(73) Assignee: GN Netcom A/S (DK)

( * ) Notice: Subject to any disclaimer, the term of this patent is extended or adjusted under 35 U.S.C. 154(b) by 639 days.

(21) Appl. No.: 10/834,144

(22) Filed: Apr. 28, 2004

(65) Prior Publication Data

US 2005/0245290 A1    Nov. 3, 2005

(51) Int. Cl.
*H04M 1/58* (2006.01)
(52) U.S. Cl. .................. 379/392; 379/390.01; 455/501
(58) Field of Classification Search .......... 379/390.01, 379/392; 455/501
See application file for complete search history.

(56) References Cited

U.S. PATENT DOCUMENTS 5,459,786 A * 10/1995 Tomiyori et al. ...... 379/390.01

FOREIGN PATENT DOCUMENTS

EP        0578604        12/1994

* cited by examiner

*Primary Examiner*—Gerald Gauthier
(74) *Attorney, Agent, or Firm*—Altera Law Group, LLC

(57) ABSTRACT

The present invention is directed most particularly to wireless communication systems for interconnection with telephone systems, and more particularly to methods and apparatus to suppress unwanted and annoying audio spikes or bursts that infiltrate the wireless system from ultimately reaching the user's earpiece. An embodiment of the invention is directed to a telephone headset amplifier system with a noise blanking or squelching capability, which attenuates the incoming audio signal when the incoming signal exceeds a predetermined threshold.

17 Claims, 4 Drawing Sheets

TELEPHONE HEADSET AMPLIFIER WITH NOISE BLANKING CAPABILITY

FIELD OF THE INVENTION

The present invention is directed generally to communication systems for interconnection with telephone systems including VoIP, and more particularly to methods and apparatus to suppress unwanted and annoying primarily audio spikes or bursts that infiltrate the system from ultimately reaching the user's earpiece or other transducer.

BACKGROUND

Communication systems for interconnection of a headset or other receiver with telephone systems are well known. Wireless system adds a new dimension to the use of specialized and report receivers interconnected into telephone (including Voice over IP VoIP networks). Such systems include a fixed transceiver which is connected to a telephone line with associated hardware to relay signals to and from a remote device. Wireless systems allow substantial freedom of movement during a telephone conversation since the user is not anchored to a telephone cord line. However, wireless systems are inherently more susceptible to static or other forms of interference. More particularly, background noise and electromagnetic interference are significant sources of poor audio quality. In addition, wireless systems are susceptible to annoying loud short-lived bursts or audio spikes.

SUMMARY OF THE INVENTION

Given the situation described above there is a need for an improved approach to eliminate or effectively suppress annoying noise spikes or other audible audio bursts before they reach the user's earpiece, particularly, in wireless communications systems.

One embodiment of the invention is directed to a telephone amplifier noise suppression device comprising a first and second electronic channel. An input signal is split equally amongst the two channels and a predetermined time delay is imposed on the signal in the second channel. If the signal in the first channel is found to exceed a predetermined threshold, then the signal in the second channel is attenuated.

Another embodiment of the invention is directed to a telephone amplifier noise suppression device comprising a first and second electronic channel. The first electronic channel prefilters the audio input and attenuates its output, which is inputted to the second channel, if its input exceeds a predetermined threshold, and passes its output signal unattenuated to the input of the second channel when its input does not exceed the predetermined threshold.

Another embodiment of the invention is directed to a method of suppressing noise pulses in a telephone set. An input signal is split equally and synchronously amongst two channels A and B. Channel A has a faster transit time, input to output, than channel B and the output of channel is A compared against a predetermined threshold value prior to channel B's signal arriving at its output. If channel A's signal exceeds the predetermined threshold value, then a control signal is initiated to blank the output of channel A. Blanking of signal A is continued until the output of channel B drops below the predetermined threshold value.

Another embodiment of the invention is directed to a method of suppressing noise pulses in a telephone set. An input signal is split equally and synchronously amongst two channels A and B. A predetermined time delay is incorporated in channel B such that the output of channel B is not immediately available to the listener. Signal A is tested against the predetermined threshold value, if signal A exceeds the predetermined threshold a fixed time delay is initiated prior to retesting signal A against the predetermined threshold value. If after the second test, and still sooner than the time delay incorporated in channel B, signal A still exceeds the predetermined threshold value, then signal B is blanked. Signal B is continuously blanked for a predetermined time wherein signal A is then tested for a third time against the predetermined threshold value. If signal A still exceeds the predetermined threshold, then the listener is warned that the audio signal has been blanked. The blanking of signal B continues until signal A drops below the predetermined threshold value.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
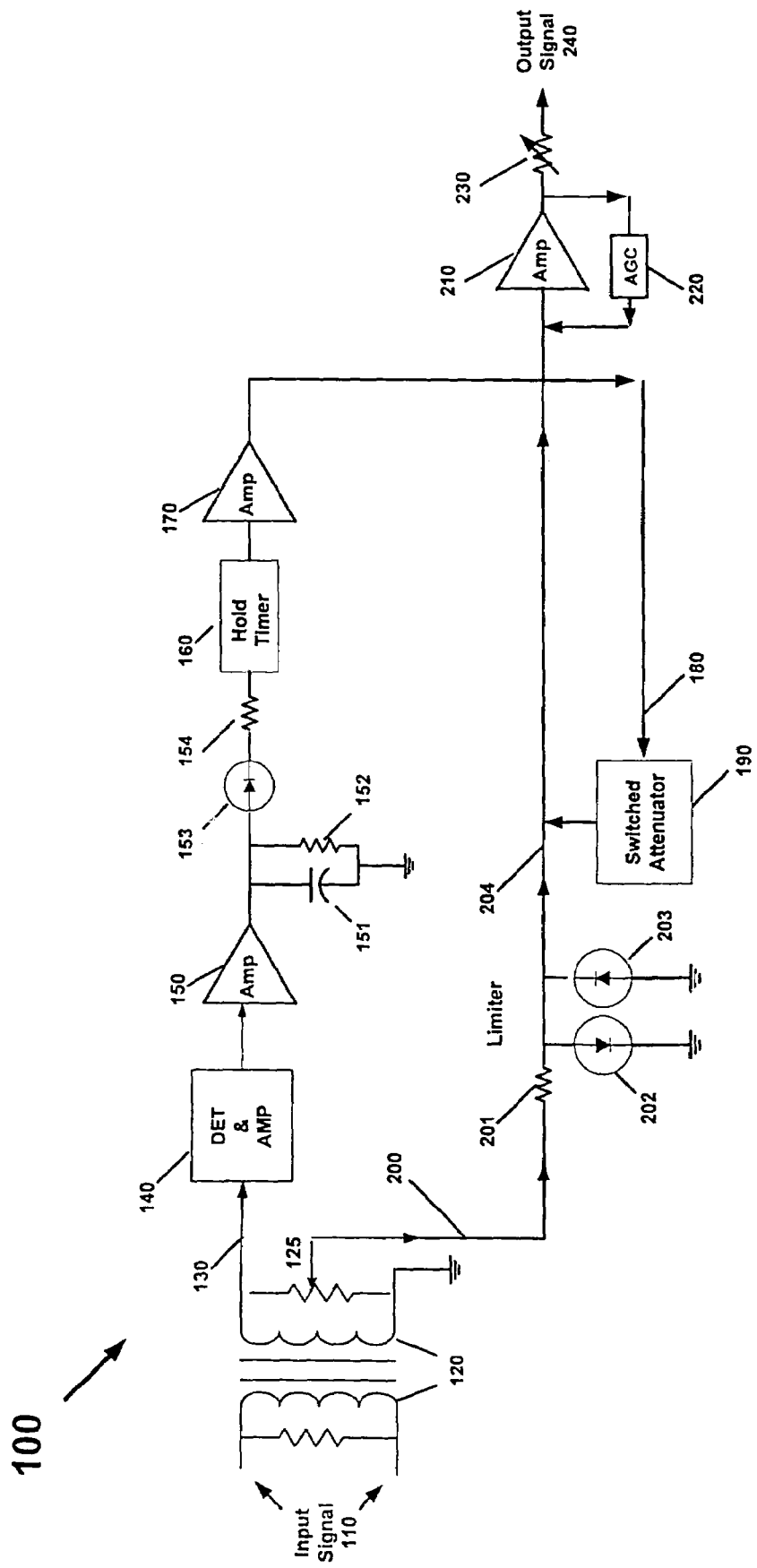
FIG. 1 depicts a functional block diagram of the circuitry to implement a noise suppression and automatic signal level control system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Generally, the present invention relates to a system, method and apparatus of automatic signal level control and noise suppression in telephone system, preferably in headset systems. A functional block diagram embodiment of an automatic signal level control system 100 for telephone headset systems is depicted in FIG. 1. An audio input signal 110 is received from either an operator's console or a host telephone handset jack. The input signal 110 is routed to the primary side of coupling transformer 120 whose output voltage may be controlled by adjusting variable resistor VR2 located on the secondary side of transformer 120. This structure functions as a signal splitter to pass the audio signal through two paths, where one path will be processed for noise suppression/gain control and the other path will be switched in and out of circuit in response to the processing of the first path.

Transformer 120 may be a step-up transformer to amplify weak input signals 110 and variable resistor VR2 may be pre-set at the factory (or user adjusted) for maximum or desired sensitivity. As mentioned earlier, systems of this type may be vulnerable to input "spikes" or bursts which may come about from switching transients within the telephone system itself or from external phenomenon such as lightning strikes near telephone lines.

The signal passing through transformer 120 is effectively split into two identical signals (though not necessarily of identical signal level) traveling on a first channel or path 130 and a second channel or path 200. In the course of normal operation, i.e., absent from the spikes or bursts mentioned earlier, the input signal 130 incident upon detector and amplifier assembly 140 is sufficiently small so as to not activate (turn-on) the detector circuitry 140, and the following linear chain of circuitry and amplifiers (units 150, 160, and 170) are also biased "off" such that signal 180 does not activate or turn-on the switched attenuator unit 190. In this environment, absent from input spikes or bursts, the pathway for audio transmission follows signal 200, which is tapped-off transformer 120 by variable resistor 125.

Signal 200 is incident upon the limiter circuitry consisting of resistor 201 and diodes 202 and 203. Diodes 202 and 203, which under normal operating conditions are not conducting, clip their output signal 204 to a maximum of approximately +/−0.5 volts peak when high level transients are present to protect components downstream. Diodes 202 and 203 may also normalize the amplitude of high level signals so that attenuation may be constant regardless of signal level. Signal 204 is coupled to amplifier unit 210, which has an automatic gain control unit 220 in its feedback loop. The automatic gain control unit 220 may have a dynamic range in the neighborhood of 25 to 40 decibels (dB). The output of amplifier 210 is coupled to variable resistor 230, which may be adjusted by the headset user and the output signal 240 is routed to the user's headset earpiece.

However, in the event of a signal spike or burst in the input signal 110 sufficient that transformer output signal 130 passes a threshold level (typically in the range of −10 dBv) to activate detector 140, the circuitry defined by elements 140 through 190, which were "off" during the spike-less environment, now all come into play. The output of the detector and amplifier unit 140 is coupled into inverting amplifier unit 150 whose output is filtered by the resistor/capacitor pair units 151/152 which introduces a charging delay to prevent fast transients from blanking the audio signal. The purpose of this circuitry to prevent false triggering of the noise suppression effect. If this delay was not present, a short spike would trigger suppression When the voltage across capacitor 151 charges to approximately 1 volt, steering diode 153 begins to conduct and allows current to flow to the hold timer circuit 160. The hold timer circuit 160 may be designed to initiate a 20 millisecond delay in its output signal to stabilize the circuitry from going into oscillations when operating in the high gain mode. The output of the hold timer circuit 160 may be inverted by amplifier 170, whose output 180 may in turn initiate turn-on of the switched attenuator unit 190.

The switched attenuator unit 190 may attenuate the input to amplifier unit 210 to a level approximately 30 dB below the threshold of the AGC unit 220, thereby the output of the AGC unit 220 drops by about 30 dB from its normal (i.e., the case where the signal input is less than −10 dBv) AGC'd output whenever the switched attenuator unit 190 is activated. This increased attenuation in signal 204 may be sufficient that the headset user is avoided the nuisance of hearing the short audio burst that would have otherwise made its way through amplifier 210 and eventually into their earpiece. Of course, during the attenuation period, the user may hear a very weak signal, but this outcome is less intrusive and indeed safer than hearing the noise which was attenuated. In reality, the user would hear nothing useful anyway if the attenuation did not occur and could be injured if the amplitude of the noise peaked.

In the event that multiple or back-to-back spikes or bursts come into the system via the input signal line 110, the above sequence of events may be repeated as necessary to attenuate the would-be annoying signal(s) and indeed, the user would not be aware of the repeated attenuations. If the noise continues for an extended period of time, the system could be programmed to inject a pleasing tone or even a vocal warning (such as "noise control in effect" etc.) so that the user did not assume that he/she had lost the connection. Likewise, an indicator light or readout to the effect "noisy environment—noise suppression functioning" could be displayed.

Figure 2:
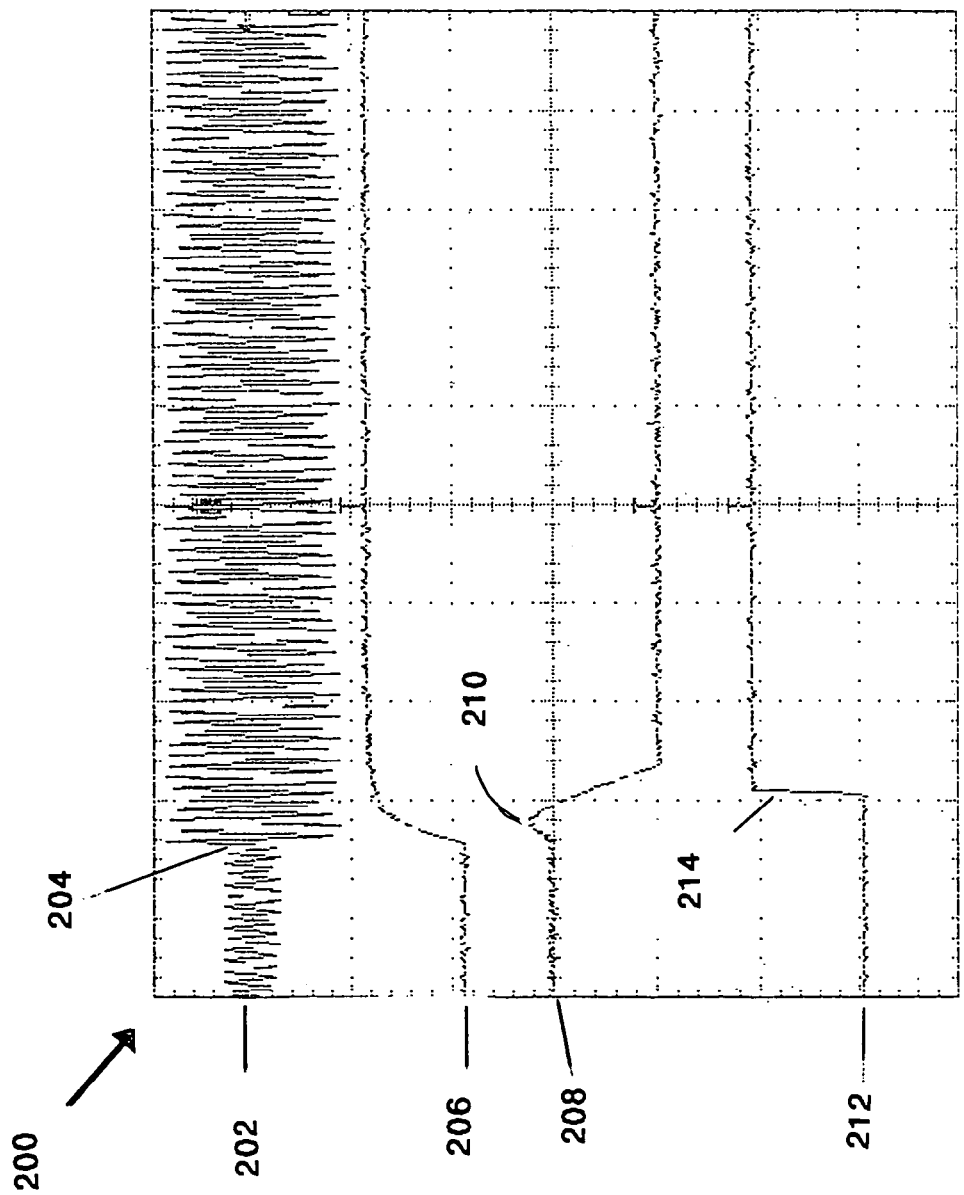
FIG. 2 shows time domain data of the present invention, consistent with the architecture outlined in FIG. 1, employing the blanking network described.

FIG. 2 shows time domain test data 200 taken from one embodiment, consistent with the architecture depicted in FIG. 1, of the present invention. Signal 202 is injected into the primary side of coupling transformer 120 (FIG. 1; element 120) at a level below the blanking threshold of −10 dBv. At time 204, the amplitude of injected signal 202 is increased above the blanking or squelching threshold of −10 dBv. Synchronous with this at time 204, signal 206 begins to charge positively due to a capacitive element in the detector and amplifier unit (FIG. 1; element 140). The charging time of the capacitive element in the detector and amplifier unit may introduce an intentional time delay to prevent fast transients from inadvertently initiating a blanking sequence. When the voltage across the capacitive element reaches a predetermined value, typically one volt, steering diode (FIG. 1; element 153) may begin to conduct as shown in signal 208 at time 210, which in turn may activate the hold timer circuit (FIG. 1; element 160). The hold timer circuit may introduce a time delay, typically on the order of 20 milliseconds, prior to activating a post amplifier device (FIG. 1; element 170) as shown in signal 212 at time 214. The leading edge of signal 212, at time 214, activates the switched attenuator device (FIG. 1; element 190) which as described earlier may introduce an attenuation on the order of 30 dB in the signal to the user's headset, thereby "blanking out" the unwanted signal burst.

Care must be taken to synchronize the attenuation of signal 204 by attenuator 190 so that the moment of attenuation of that signal corresponds to the same portion (in time) of the arrival of the noise signal at that point. In this analog embodiment, this is accomplished by careful tuning of the R-C circuits in both first and second channels so that the attenuation control signal 180 attenuates at precisely the time the noise arrives at the switched attenuator 190 on 204. Either the first channel path 130 has to have a faster response time than the second path 200 or the second channel must have a slower response time than the first, otherwise, the attenuation control signal from the first channel will misalign with the identical noise pulse on the second channel and the user will either miss valuable audio information or a portion of the noise itself.

The above circuit has accomplished the desired result by analog means but of course a digital version of this concept could likewise be implemented by persons skilled in the art. In the digital version of this invention, the timing problem is solved by tagging each signal with synching information, by noting the address of the byte which corresponds to the first noise segment, or by other traditional signal means. The synchronized timing of signals in the second channel is not dependent upon R-C timing but clocking of the synching methods.

In operation, the input signal (see FIG. 1; element 110) may be digitized or processed in its original analog form. The input signal is then split 50/50 into two equal time synchronized signals B & A. Then an intentional short time delay is introduced into signal B to allow for comparing signal A with the predetermined threshold mentioned earlier. Then signal A is compared with the threshold and if A is less than the threshold, then B is routed to the user's earpiece, otherwise signal B is blanked per the discussions described earlier. If B is blanked, a wait command is issued to allow for the input spike to dissipate. The input signal is digitized again and split as before, and the new A is compared with the threshold level, and if A is now reduced below the threshold signal, then signal B is routed to the user's earpiece, otherwise signal B is blanked again.

Subsequent to the second blanking of the input signal, a message may be sent to the user informing the user of the "blanked" condition. Then signal A is again compared with the threshold and as before, if A is now reduced below the threshold signal, then signal B is routed to the user's earpiece, otherwise signal B is blanked again. The above interrogation of A is repeated successively until A falls below the threshold, wherein signal B will then be routed to the user's earpice.

Figure 3:
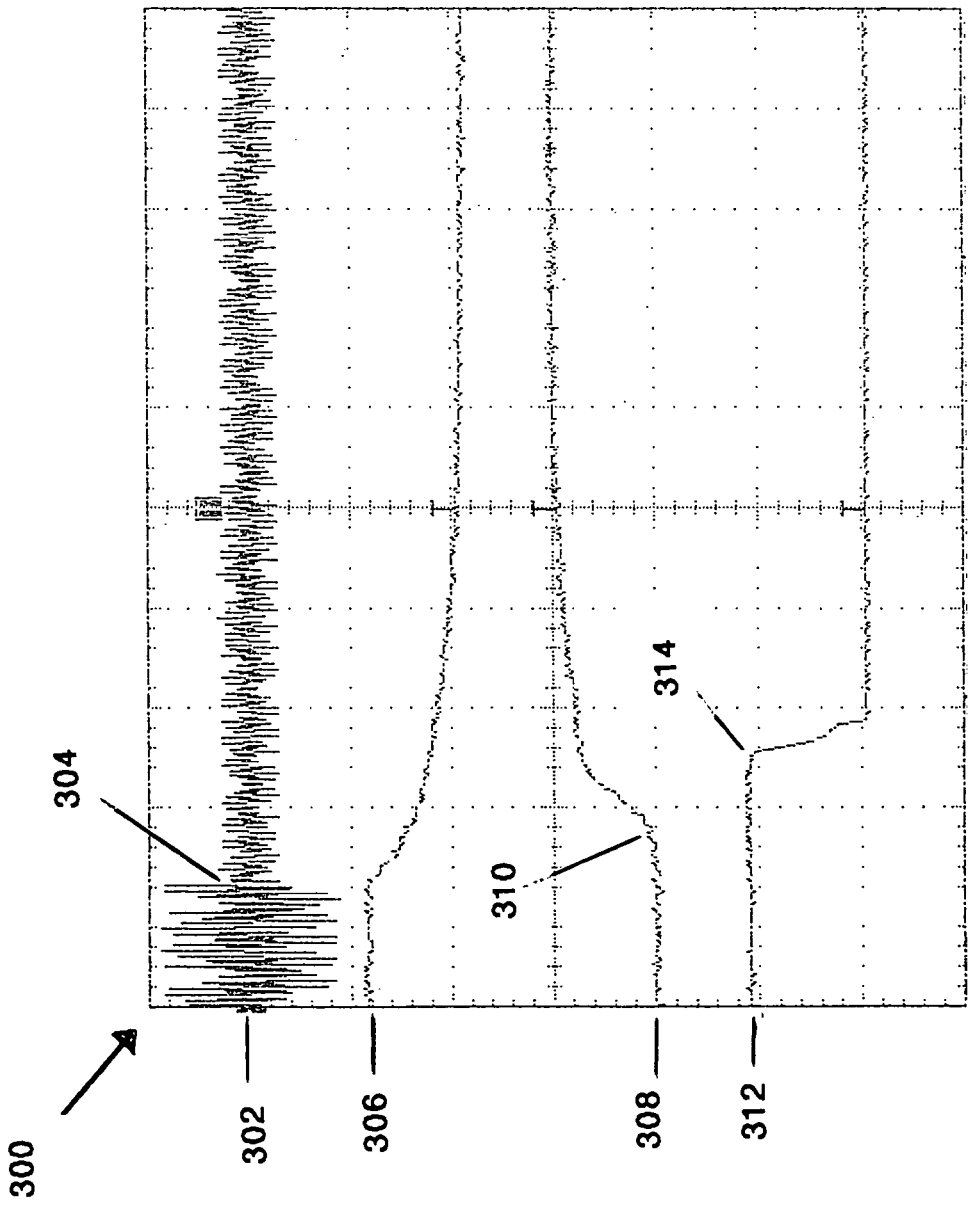
FIG. 3 shows time domain data of the present invention, consistent with the architecture outlined in FIG. 1, employing de-activation of the blanking network.

FIG. 3 shows test data 300, which is a continuation in the time domain of the data, depicted in FIG. 2. Whereas FIG. 2 outlined the linear series of events which ultimately led to "blanking" an input spike above the −10 dbv threshold level, FIG. 3 depicts the series of events when the input signal is reduced below the −10 dBv threshold level, and the circuitry resumes normal audio operation without switched attenuation. Signal 302 is shown initially above the −10 dBv threshold level. At time 304, input signal 302 is reduced below the −10 dBv threshold and synchronous with this, the capacitive element in the detector and amplifier device (FIG. 1; element 140) begins to discharge as depicted in signal 306. When the voltage across the capacitive element falls below approximately 1 volt, the steering diode (FIG. 1; element 153) stops conducting as depicted in signal 308 at time 310, this in turn deactivates the hold timer device (FIG. 1; element 160). And finally, the switched attenuator device (FIG. 1; element 190) is turned off, as depicted in signal 313 at time 314.

Figure 4:
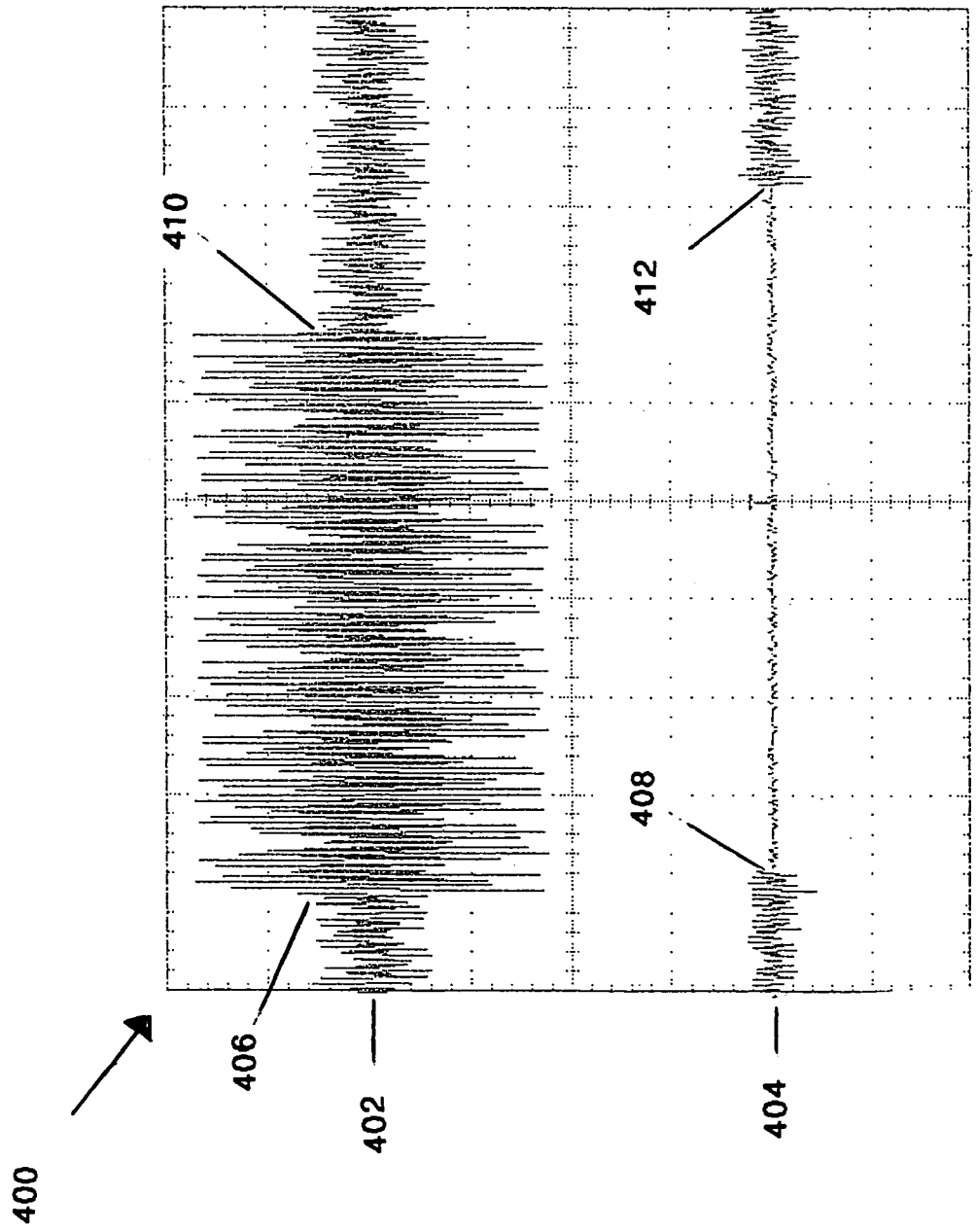
FIG. 4 shows time domain test data of the present invention, consistent with the architecture outlined in FIG. 1, which depicts the relationship between the input signal and the output signal to the user's headset.

FIG. 4 shows time domain test data 400 which depicts the relationship between the input signal (see FIG. 1, element 110) and the output signal 404 to the user's headset (see FIG. 1; element 240). Initially, the input signal 402 is injected below the threshold level of −10 dBv and the output signal 404 shows modulation indicative of normal audio transmission. At time 406, the input signal 402 is increased above the threshold level of −10 dBv, and approximately 20 milliseconds later at time 408, the output signal is significantly attenuated (i.e., blanked) for the entire duration of the time the input signal is shown above the threshold level. At time 410, the input signal 402 is reduced back to below the threshold level of −10 dBv and remains below the threshold level for the remainder of the data. Approximately 150 milliseconds later at time 412, the output signal 404 to the user's headset resumes normal audio transmission and one complete cycle of blanking and recovery has been demonstrated.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A headset telephone amplifier noise suppression device for blanking, at least, short bursts of unwanted noise from reaching the users ear via a headset earphone, comprising:

first and second electronic channels each having an input and output and each receiving a substantially identical input signals;

Said second electronic channel including a delay of a predetermined value;

Said first electronic channel including a detector capable of sensing the amplitude of said input signal and outputting a control signal in response to said sensed amplitude, An attenuator responsive to said first control signal to attenuate said second channel output when said predetermined value is exceeded thereby blanking sound to the user's earphone.

2. A device according to claim 1 further including a first delay circuit in said first channel for delaying the issuance of said control signal if the time the amplitude exceeds a predetermined level is shorter than a fixed period, so that amplitude spikes of limited duration do not cause blanking of the second signal.

3. A device according to claim 2 further including a second delay circuit in said first channel for delaying the removal of said control signal for a fixed period of time after said amplitude dropped below said predetermined level, so that said control signal may be reinstated if further amplitude spikes appear shortly after they have disappeared.

4. A device according to claim 1 further including an advisor circuit responsive to said control signal to warn the user of an extended attenuation period.

5. A device according to claim 4 wherein said advisor circuit includes a timer for delaying the initiation of the warning until a second predetermined period has elapsed.

6. A device according to claim 4 wherein said advisor circuit generates an audible signal inserted into said second signal of said second channel at least during a portion of the time when said control signal is present.

7. A device according to claim 4 wherein said advisor circuits activates a visible display capable of providing a warning that the second audio output is deliberately attenuated by said device and not a system failure.

8. A device as recited in claim 2, wherein the first electronic channel issues a control signal to attenuate the output of the second electronic channel before the unattenuated signal exits the second electronic channel.

9. A telephone amplifier noise suppression device, comprising:

first and second electronic channels each having an input and output and each receiving a substantially identical input signals;

Said second electronic channel including a delay of a predetermined value;

Said first electronic channel including a detector capable of sensing the amplitude of said input signal and outputting a control signal in response to said sensed amplitude, An attenuator responsive to said first control signal to attenuate said second channel output when said predetermined level is exceeded;

further including a synchronizer which matches the portion of the first signal which triggers the control signal with the portion of the second signal which is attenuated, so that a user will not hear any portion of the second signal which corresponds to amplitudes above a predetermined level.

10. A telephone amplifier noise suppression device, comprising:
first and second electronic channels each having an input and output and each receiving a substantially identical input signals;
Said second electronic channel including a delay of a predetermined value;
Said first electronic channel including a detector capable of sensing the amplitude of said input signal and outputting a control signal in response to said sensed amplitude,
an attenuator responsive to said first control signal to attenuate said second channel output when a predetermined level is exceeded;
wherein said delay in said second channel is effected by an R-C network in said second channel configured to synchronize with the time required to initiate said control signal such that attenuation of said second channel signal corresponds substantially to the same time at which the amplitude exceeded said predetermined level in said first channel.

11. A telephone amplifier noise suppression device, comprising:
first and second electronic channels each having an input and output signal;
said first electronic channel including a detector capable of sensing the amplitude of said input signal and outputting a signal to the input of the second electronic channel in response to said sensed amplitude,
wherein the first electronic channel prefilters the audio input signal and attenuates the audio input signal if the signal exceeds a predetermined threshold level, and passes the signal unfiltered to the second electronic channel if the signal does not exceed the predetermined threshold level and wherein the input signal is routed simultaneously to the input of the first and second electronic channels; and the first electronic channel has a faster response time than the second electronic channel to test whether the input signal exceeds the predetermined threshold level.

12. A telephone amplifier noise suppression device. comprising:
first and second electronic channels each having an input and output and each receiving a substantially identical input signals;
Said second electronic channel including a delay of a predetermined value;
Said first electronic channel including a detector capable of sensing the amplitude of said input signal and outputting a control signal in response to said sensed amplitude,
An attenuator responsive to said first control signal to attenuate said second channel output when said predetermined level is exceeded, wherein the telephone headset amplifier device receives wireless audio input signals.

13. A device as recited in claim 12, wherein the telephone headset amplifier device receives input signals from a telephone console.

14. A device as recited in claim 12, wherein the telephone headset amplifier device receives input signals from a handset output of a telephone set.

15. A telephone amplifier noise suppression device, comprising:
first and second electronic channels each having an input and output and each receiving a substantially identical input signals;
said second electronic channel including a delay of a predetermined value
said first electronic channel including a detector capable of sensing the amplitude of said input signal and outputting a control signal in response to said sensed amplitude,
a first delay circuit in said first channel for delaying the issuance of said control signal if the time the amplitude exceeds a predetermined level is shorter than a fixed period, so that amplitude spikes of limited duration do not cause blanking of the second signal.

16. A method of suppressing noise pulses in a telephone set comprising the steps of
a) splitting a signal into two identical components A and B at an input end,
b) creating first and second signal paths such that a signal at the input to the second path will arrive later at the output of the second than the first path,
c) testing the amplitude of signal A against a predetermined amplitude level,
d) in the event that the amplitude of signal A exceeds the predetermined value after the fixed period of time, send a control signal to blank signal B,
e) synchronize the blanking action of signal A to the same moment in signal B and attenuate signal B as long as signal A exceeds the predetermined value,
f) restore the amplitude to signal B when signal A's amplitude drops to below said predetermined value.

17. A method of suppressing noise pulses in a telephone set comprising the steps of
a) splitting a signal into two identical components A and B at an input end
b) inserting a predetermined delay into transmission of signal B such that the output will not be immediately available to the listener at an output end;
c) testing the amplitude of signal A against a predetermined amplitude level,
d) in the event the level of signal A exceeds the predetermined, introduce a wait a fixed period of time,
e) In the event that the amplitude of signal A still exceeds the predetermined value after the fixed period of time, send a blanking control signal to signal B,
f) synchronize the blanking action of signal A to the same moment in signal B and attenuate signal B as long as signal A exceeds the predetermined value,
g) maintain blanking of signal B for a second predetermined period after signal A has fallen below the predetermined amplitude to allow for gaps in the noise detected in signal A,
h) in the event that blanking of signal B persists past a third predetermined time period, warn the listener at the output end of the cause of the blanking action,
i) restore the amplitude to signal B when signal A's amplitude drops to below said predetermined value.

* * * * *